United States Patent [19]

Dickens

[11] 4,104,673
[45] Aug. 1, 1978

[54] FIELD EFFECT PENTODE TRANSISTOR

[75] Inventor: Lawrence E. Dickens, Baltimore, Md.

[73] Assignee: Westinghouse Electric Corp., Pittsburgh, Pa.

[21] Appl. No.: 766,401

[22] Filed: Feb. 7, 1977

[51] Int. Cl.² .............................................. H01L 29/80
[52] U.S. Cl. ........................................ 357/22; 357/22; 357/55; 357/68
[58] Field of Search ........................ 357/15, 22, 55, 68

[56] References Cited

U.S. PATENT DOCUMENTS

| 3,634,702 | 1/1972 | Drangeid | 357/22 |
| 3,699,408 | 10/1972 | Shinoda et al. | 357/22 |

*Primary Examiner*—Edward J. Wojciechowicz
*Attorney, Agent, or Firm*—H. W. Patterson

[57] ABSTRACT

A field effect pentode transistor, which provides a gain over an extremely broad band of frequencies is disclosed. The transistor has source and drain electrodes defined by ohmic contacts, a first gate input control electrode defined by a Schottky-barrier, a screen electrode, and a second control gate Schottky-barrier electrode. The screen electrode is an ohmic contact located between the first and second gate control electrodes; and the second control electrode is located between the screen electrode and the drain electrode.

7 Claims, 6 Drawing Figures

FIELD EFFECT PENTODE TRANSISTOR

BACKGROUND OF THE INVENTION

The present invention relates to field effect transistors, and more particularly to a pentode field effect transistor.

Field effect transistors, (FET) conventionally, are three terminal devices having source and drain regions formed on an upper surface of a semiconductor wafer and interconnected by a channel region, and a gate region overlying the channel region which controls current flow through the channel. The FET operates on a principle different from that of the conventional transistor. Briefly, the FET consists of a bar of semiconductor material, the resistance of which is modulated by varying the effective cross-sectional area of the bar by electrical means. A layer of high resistivity (semi-insulating) semiconductor material is utilized to support a layer of low resistivity semiconductor material which is grown on the first layer by several well known means. The low resistivity layer is contacted at one end by an ohmic contact, referred to as a source, and at the other end by an ohmic contact referred to as a drain. The conduction current to be modulated is carried between the source and drain contacts. The gate contact is typically, but not necessarily, a Schottky-barrier deposited upon the low resistivity layer and so disposed that the cross-sectional area available for conduction between the source and the drain is a function of the magnitude of the bias potential existing between gate and source. In the fabrication of FET's, it has been found necessary to avoid overlap between the drain region and the gate electrode to reduce the well known Miller-type capacitance in order to increase the freqeuncy of the device.

Recently, with the improvement in gallium arsenide (GaAs) technology and the refinement of pattern definition and etching techniques, GaAs field effect transistors with very small gate lengths have been produced. The use of such devices in amplifiers permits good gain and noise properties through the X and $K_u$ frequency bands, with usable gain to 20 gigahertz, for example.

The use of computer aided design techniques has considerably eased the problem of realizing both broad and narrow band microwave amplifier design. However, the high input and output impedance of the FET presents a major design problem, particularly at the lower microwave frequencies, such as in L band. Also, acceptable match requirements can limit the usable bandwidth. The problems encountered in using the FET involve the gate-to-drain capacitance similar to the grid-to-plate capacitor of a vacuum triode which was so great that oscillation, could occur whenever the load resistance was made large enough to provide useful voltage amplification. Thus, the resulting feedback is difficult to handle.

The problem of grid-to-plate capacitance was originally attacked by the use of the vacuum pentode, which tube provided a higher output impedance with lower interelectrode capacitances; and in particular, a much reduced grid-to-plate feedback capacitance. This resulted in a much improved gain-bandwidth product and a higher frequency to which the tube could be used in the grid input, grounded cathode configuration. The penalty was the increased noise figure inherent with the pentode because of the added noise arising due to partitioning (partition noise) of the cathode current between the plate and the screen.

To overcome the disadvantages of the vacuum pentode, it was proposed to provide a two stage amplifier comprising a pair of vacuum triodes in cascade arrangement, which could be considered analogous to a cascade arrangement of two conventional FET's. Refer to FIG. 1, which shows two conventional field effect transistors 10 and 11 connected in the well known Wallman arrangement. A source 12 of the FET 10 is connected to signal ground. The drain 13 of the FET 10 is signal connected to source 15 of the FET 11. The FET 11 is connected "grounded gate" in that gate 17 is signal connected to ground; and the amplified signal travels from drain 16 of the FET 11 to a load designated B. The signal input is at point A and connects to gate 14 of the FET 10. The feedback from the drain 13 of the FET 10 to the gate 14 connected to the input A causes a special effect commonly called the "Miller effect." This effect is produced by the gate 14 to drain 13 interelectrode capacitance, referred to as $C_{gp}$. Because the voltage at the drain 13 drops by K volts for each volt rise at gate 14 (where K is the voltage gain of the FET 10), the capacitive current flowing into the gate 14 is of a magnitude which would be caused by a capacitor of magnitude $(K + 1) C_{gp}$ if it were connected from the gate 14 to ground. Thus the effect is to cause unwanted capacitive loading of the input A if the voltage gain K is of a useful level.

With respect to the cascade arrangement of the prior art FIG. 1, assuming that the two FET's 10 and 11 are identical, and each has a transconductance $G_m$; the voltage gain $K_{AB}$ from the input A to the output B is approximately given by $K_{AB} = G_m R_B$, where $R_B$ is the load at point B. It is well known that $K_{AB}$ can be made a reasonable and useful magnitude. Also, the load resistance presented by the source 15 to the drain 13 is well approximated by $1/G_m$ and thus the voltage gain of the first stage is approximately unity. If a single FET were used to obtain the full gain $K_{AB}$, the additional input capacitance loading is $C_{gp}(K_{AB}+1)$. The cascade or Wallman circuit configuration, is such that the additional loading is $2C_{gp}$. Thus there is a reduction of the effective loading by a ratio (½) $(K_{AB}+1)1$.

Thus, it is desirable to provide a field effect transistor which has performance substantially better than that attainable with the conventional single field effect transistor devices, such as a better gain-bandwidth product, lower noise figure, higher input impedance, and high RF power handling capability. Also, it is desirable to provide in such single improved device all of the benefits afforded by the well known cascade arrangement of separate FET devices.

SUMMARY OF THE INVENTION

Briefly, the present invention relates to a field effect pentode transistor including an active semiconductor material supported by a layer of semi-insulating semiconductor material, a source, drain, and screen electrodes in ohmic contact with the epitaxial layer. First and second gate electrodes adjacent the active layer form Schottky-barrier gate contacts. The portions of the electrodes that are not adjacent the epitaxial layer may be formed by contact metallization, either directly to the supporting layer, or to a further insulating layer, such as $SiO_2$ interposed between the metallized electrodes and the supporting layer.

DESCRIPTION OF THE DRAWINGS

Referring to FIGS. 2 and 3, a field effect pentode transistor according to one embodiment of the invention is generally referred to as 20. The transistor 20 includes a supporting layer of high resistivity semi-insulating, semi-conductor material 21, such as semi-insulating gallium-arsenide. An epitaxial semi-conductor layer 22, such as epitaxially grown gallium-arsenide is deposited on a portion of surface 23 of the active layer 21, which carries the current. The transistor 20 includes a metal source electrode 24, a drain electrode 25, a first control gate electrode 26, a second gate electrode 27, and a screen electrode 28.

Figure 1:
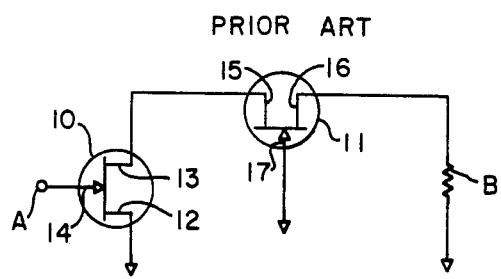
FIG. 1 is a schematic diagram of a prior art cascade arrangement of two field effect transistors that provide a function similar to the device of the present invention.

The source electrode 24, the drain electrode 25, and the screen electrode 28, are in ohmic contact with the epitaxial layer 22; and the portions of the electrodes which overlie the supporting layer 21 exterior of the region 22 are metalized to such layer 21. The first and second gate electrodes 26 and 27 from Schottky-barrier gate contacts to the epitaxial layer 22. The portion of the electrodes 26 and 27 overlying the supporting layer 21 are metalized in the same manner as the electrodes 24, 25, and 28. The contact metalization portions of the electrodes exterior of the layer 22 may be deposited in direct contact with the layer 21, or, further insulating layer, such as $SiO_2$ may be interposed between the metalization and the supporting layer 21 to further reduce parasitic reactances and losses.

The portions of the individual electrodes which extend outwardly from the epitaxial layer to be in direct contact with the supporting layer surface 23 permit electrical connection to external circuitry. For example, circular portion 30 of the first control gate 26 provides a contact area for external connection. Contact areas 31 not overlying the epitaxial layer 22 permit external connection of the source electrode 24. Areas 32 of the screen electrode 28 not overlying the epitaxial layer 22 permit external connection of the screen electrode. Similarly, areas 33 of the second control gate electrode 27 and area 34 of the drain electrode 25 are utilized for external connection.

Figure 5:
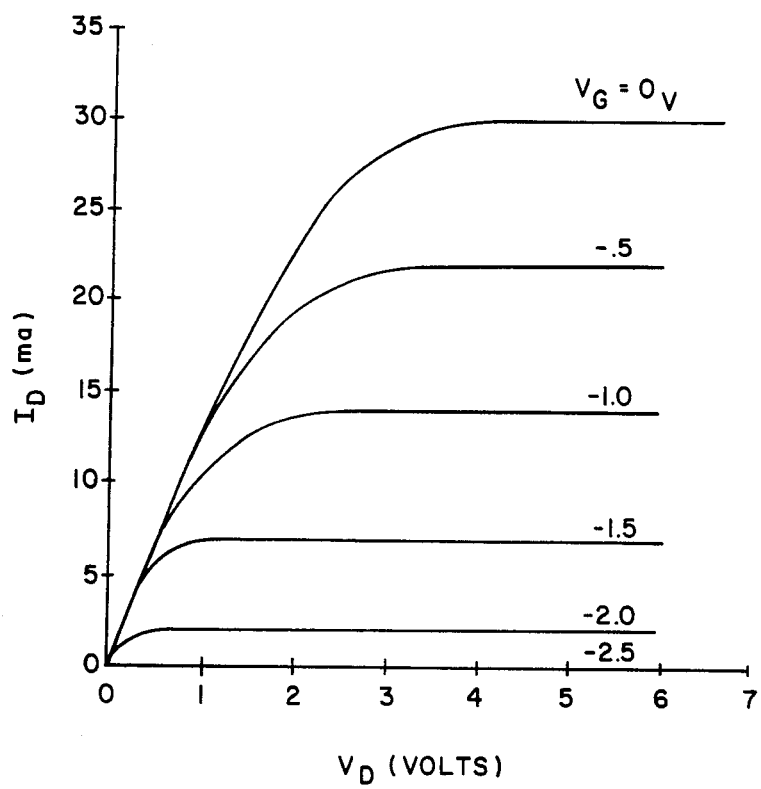
FIG. 5 is a typical family of curves of a (ma) conventional FET illustrating the relationship of the drain current $I_D$ to the drain voltage $V_D$ as a function of the gate to source voltage $V_G$.

Assuming that the areas 31 and 33 are connected externally to be at RF ground potential; or connected to each other internally by having areas 31 and 33 in common (not shown); then the source 24 and the second gate 27 are both at RF ground potential simultaneously. The gate 27 is connected directly to ground without parasitic elements due to external connections; such as providing bonding wires that connect the gate 27 to an external isolated pad, then through a package lead, and finally to a ground connection in the external circuitry, for example. Also, it is assumed that the screen electrode 28 is disconnected from external circuitry and represents a minimum loading by parasitic elements. For correct biasing, the potential is applied to the first gate 26, reverse biasing the Schottky barrier under the electrode 26. Suitable potential is applied to the drain electrode 25 to establish the operating point of the device. With this arrangement, current flows from the source 24, under the gate 26, through the screen 28, under the gate 27, and is collected in the drain 25. The current flows into the contact pad 31 for the source 24 and out the drain contact pad 34 to the external circuit. With the source 24 grounded, and a sufficiently large potential applied to the drain 25, the current flowing through the transistor 20 is determined by the bias applied to the first control gate 26. If the gate widths are equal, then the screen 28 is at a potential equal in magnitude but opposite in sign to that applied as a bias to the control gate 26. Referring to FIG. 5, which shows a typical characteristic curve for a field effect transistor device, and determining that a minimum noise figure is obtained with about −1.7 volts bias applied to the gate 26, then the screen 28 is at approximately +1.7 volts with at least 3.4 volts necessarily applied to the drain 25. Actually, the drain is typically held at 5 volts or more, for example.

Figure 2:
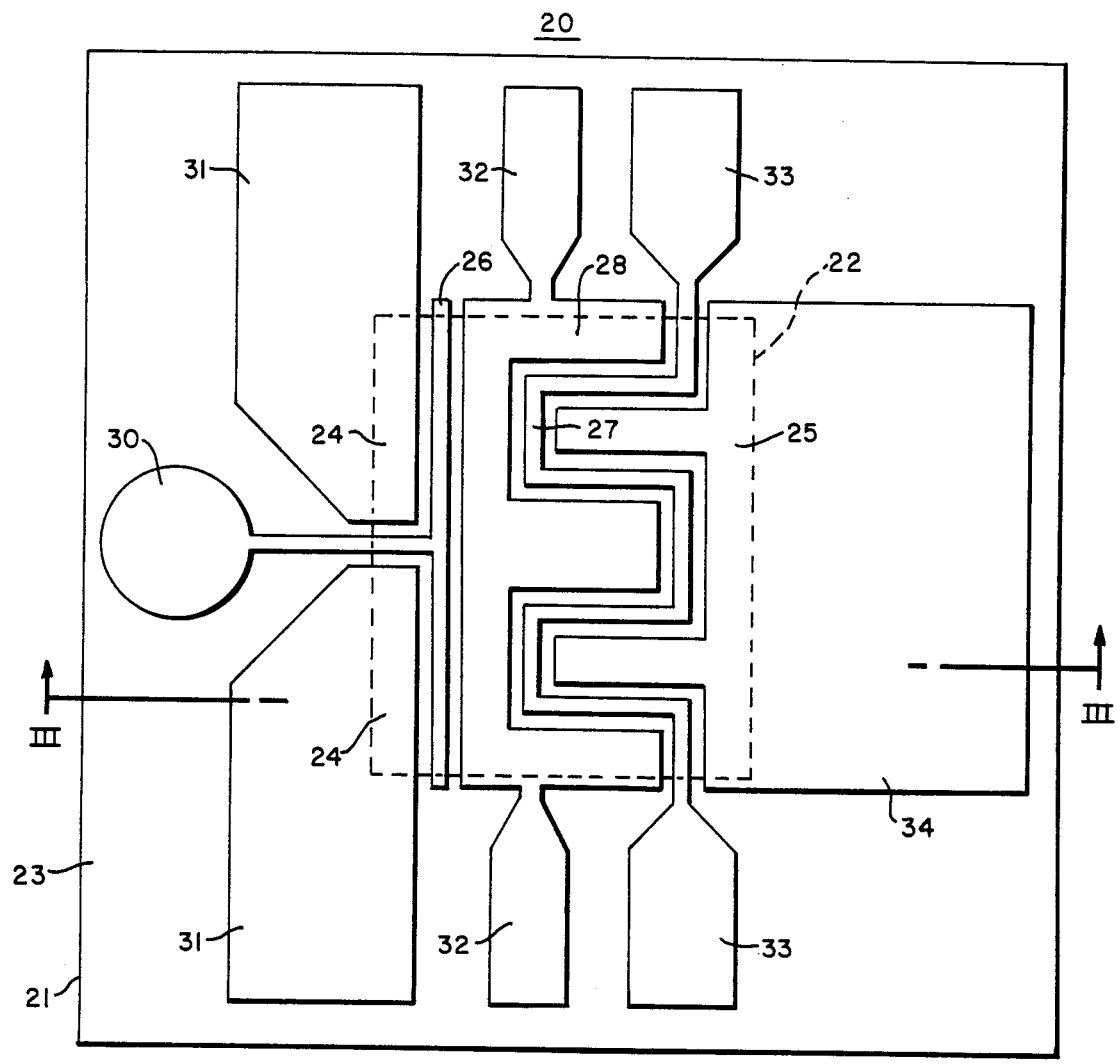
FIG. 2 is a plan view of a field effect pentode transistor according to one embodiment of the present invention.
Figure 3:
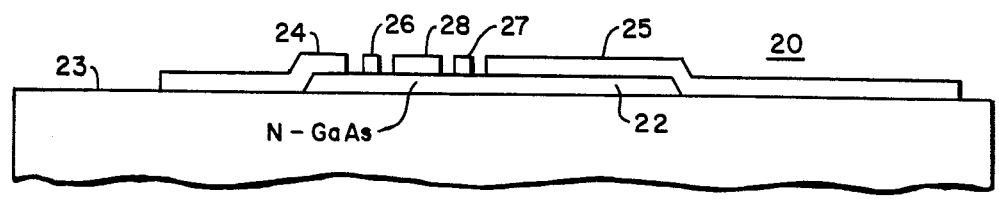
FIG. 3 is a sectional view taken on line III—III of FIG. 2.
Figure 4:
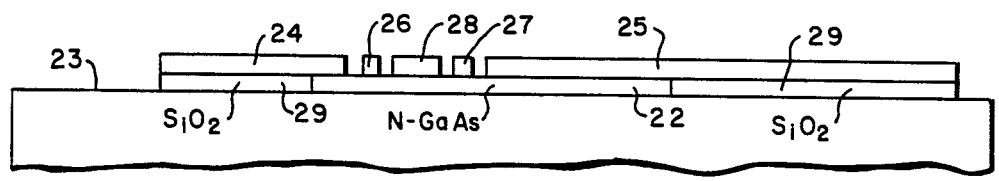
FIG. 4 is a sectional view of another embodiment of the invention illustrating an interposed layer of $SiO_2$.

It is to be noted, in the embodiment of FIG. 2 that the width of the second control gate 27 is illustrated to be substantially greater than the width of the control gate 26, such as two to seven times, for example.

The transconductance, $G_m$, is a function of the gate voltage, and in general, the maxium $G_m$ is obtained with minimum (0) gate voltage. A fundamental figure of merit frequently used is the $G_m/C_G$ ratio, which quantity is proportional to gain-bandwidth product. The maximum operating frequency, $f_m$, is defined as the frequency at which the current through $C_g$ is equal to the current of the current generator $G_m V_G$:

$$f_m = \frac{G_m}{2\pi C_G} \qquad (1)$$

This parameter, $f_m$, is a function of the carrier concentration and thickness of the active layer 22, and the length of the gate 26; but is theoretically independent of the width of the gate. Because both $G_m$ and $C_G$ are proportional to gate width, the proportionally constant drops out. The term, $f_m$, and the figure of merit $G_m/C_G$ can obviously be used interchangeably. Thus, $f_m$ is greatest in the vicinity of zero gate voltage. If such a gate voltage were to be used with a configuration where the width of the gates 26 and 27 were similar, the effective screen to source voltage would be zero resulting in impaired operation of the device 20.

However, as previously mentioned, the width of the gate 27 is configured to be greater than the width of the gate 26. Although in FIG. 2 this elongation is provided by an interdigital configuration, it is understood, that such greater widths could be obtained by other configurations such as serpentine, for example, on the epitaxial layer 22.

Assuming that the per unit width parameters of the first and second control gates are identical, the current through the screen 28 and under the gate 27 and collected in the drain 25 for a given voltage on the gate 27 will be U times the current through the source 24, under the gate 26, and through the screen 28 for the same gate voltage. U represents approximately the ratio of the widths of the second and first gates 27 and 26 respectively; that is, if W is the width of the gate 26, the full effective width of the second gate 27 is UW. For example, assuming that the voltage-current characteristics of FIG. 5 apply and a gate voltage for the gate 26 of −1.0 volts is desired with the attendant increase in current and $G_m$ from that obtained with the −1.7 volts previously used; then stable operation of the device is obtained with the screen 28 at about 2 volts and a screen current of about 14 ma if $U \approx 7$.

Referring to a different arrangement of FIG. 2 than that previously described, a source 24 is at ground RF potential, but the second gate 27 is connected to a separate and independent DC potential to allow a more optimum operating point for the screen 28 which is left floating and disconnected from external circuitry. With this arrangement also, the widths of the gates 26 and 27 although illustrated as being of unequal lengths are not necessarily so. By way of example, assume that the characteristics of FIG. 5 apply and that the screen 28 is to be at +5 volts and the control gate 26 is to be at zero potential, then the drain current from the drain 25 is approximately 30 ma if the second gate 27 is twice as wide as the first gate 26, and is biased to a potential of approximately +4 volts with a potential of about 10 volts being applied to the drain electrode 25.

In yet another arrangement, the source electrode 24 may be grounded or biased by way of the contact pads 31, according to particular design through the external circuitry. The control gate 26 by way of the contact pad 30 can be incorporated into an external circuit wherein a potential is applied, reverse biasing the Schottky barrier under the electrode 26; and suitable potential applied to the drain electrode 25 to establish the operating point of the device. The second gate 27 through which contact area 33 may be incorporated into the external circuit as already described. The screen electrode 28 by way of its contact areas 33 may be used for specific design purposes, such as frequency compensation of overall amplifier stage.

Figure 6:
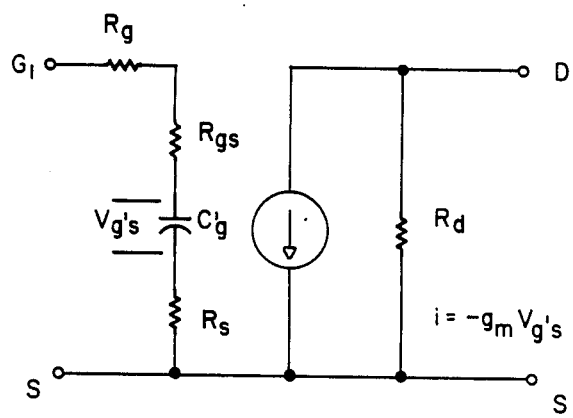
FIG. 6 is an equivalent circuit of the transistor of the present invention.

Referring to the equivalent circuit diagram of FIG. 6, it is known that the power gain, $G_p$, of the field effect pentode transistor 20 can be well approximated by $$G_p = \frac{G_m^2 R_{in} R_L}{\omega^2 C_g^2 R_{in}^2 \left(1 + \frac{R_L}{R_d}\right)^2} \quad (2)$$

The feedback capacitance of the transistor is assumed sufficiently small as to be negligible. The equivalent circuit of FIG. 6 is sufficiently accurate as long as $R_S << R_L$. $R_{in}$ of the above equation is then given as $$R_{in} = R_g + R_s + R_{gs}\left[1 + \frac{C_{gs}}{C_g}(1 + \frac{1}{U})\right]^{-1} \quad (3)$$

and the effective gate capacitance, $C_g'$, is well approximated $$C_g' = C_g + (1 + \frac{1}{U}) C_{gs} \quad (4)$$

where
$C_g$ = gate to source capacitance,
$C_{gs}$ = gate to screen capacitance, and
$U$ = ratio of the width of the second gate 27 to the width of the first gate 26.

The output resistance $R_d$ of the transistor 20 is many times greater than that of the conventional three element FET. Let $R_{d1}$ and $R_{d2}$ be the output resistances of the first and second FET's 10 and 11 of the conventional dual FET representation as shown in FIG. 1, and let $G_{m2}$ be the $G_m$ of the second FET 11, then the output resistance of the combination will be $R_d$, where $$R_d \approx R_{d2}(1 + G_{m2} R_{d1}). \quad (5)$$

The capacitance term, $C_g''$, includes $C_{gs}$ multiplied by a factor equal to or less than 2; i.e. $(1 + 1/U) \leq 2$. In the conventional FET with a reasonable voltage gain per stage, the equivalent multiplication factor would be several times greater than 2. This term, when squared, and in the denominator of the expression for power gain, can drastically limit the power gain. These two factors, $C_g'$ being much lower and $R_d$ (and hence $R_L$) being much larger, lead to a substantial improvement in the power gain of the transistor 20 and the gain-bandwidth product.

The noise figure of the present device 20 is also substantailly improved. Reducing the feedback term allows $R_{in}$ to be larger relative tp the loss components $R_g$ and $R_s$, and $C_g'$ is smaller yielding a larger effective $f_m$ (see equation 1). The relative effect on the noise figure F can be seen from the approximate expression for noise figure $$F = 1 + \frac{A_1}{R_o} + \left(1 + \frac{f^2}{A_2 f_m^2}\right)\frac{A_3}{R_o}, \quad (6)$$

where $A_1$, $A_2$, and $A_3$ are noise parameters which depend on device geometry and $f_m$ is given by equation (1). $R_o$ is taken to be the signal source resistance. If, for maximum power transfer, $R_o = R_{in}$, it is obvious that anything which tends to increase $R_{in}$ will tend to decrease F. Likewise, anything which will tend to increase $f_m$ will tend to decrease F.

It is understood that various modifcations can be made, without departing from the spirit or scope of the present invention. For example, although the Schottky barrier gate has been described, it will be understood by those skilled in the art that for particular applications, a diffused junction or insulated gate type of fabrication may be used to advantage. Also that the configuration of the gates to achieve desired widths can be varied.

I claim:
1. A field effect pentode transistor, comprising a first supporting layer of semi-conductive material, a second active semi-conductor layer formed on one face of the first layer,
a source electrode and a drain electrode spaced from each other one portion of each said electrode being formed on the first layer and a second portion of each said electrode overlying and being in ohmic contact with the second layer, a screen electrodes spaced from and positioned between the source and drain electrodes, overlying and in ohmic contact with said second layer, a first control gate electrode formed on the second layer spaced from and positioned between the source and screen electrodes, and a second control gate formed on the second layer spaced from and positioned between the drain and screen electrodes.

2. A field effect pentode transistor according to claim 1 wherein each of the first and second gate electrode forms a Schottky barrier with the second layer.

3. A field effect pentode transistor according to claim 1 where the second layer is an epitaxial layer.

4. A field effect pentode transistor according to claim 1 wherein the width of the second control gate is greater than the width of the first control gate.

5. A field effect pentode transistor according to claim 4 wherein the width of the second control gate is from two to seven times greater than the width of the first control gate.

6. A field effect pentode transistor, comprising a first supporting layer of semi-conductive material, a second active semi-conductor layer formed on one face of the first layer, an insulating layer formed on said one face of the first layer exterior of the second layer,
a source electrode and a drain electrode spaced from each other, each said electrode having one portion formed on the insulating layer and another portion in ohmic contact with a second layer, a screen electrode spaced from and positioned between the source and drain electrodes in ohmic contact with the second layer, a first control gate electrode formed on the second layer spaced from and positioned between the source and screen electrodes, and a second control gate formed on the second layer spaced from and positioned between the drain and screen electrodes.

7. A field effect pentode transistor according to claim 6 wherein the third layer is $SiO_2$.

* * * * *